United States Patent [19]

Kleinschmidt

[11] Patent Number: 4,471,257

[45] Date of Patent: Sep. 11, 1984

[54] MONITORING SYSTEM FOR ELECTRICALLY ACTUATED CONTROL ELEMENT

[75] Inventor: Peter Kleinschmidt, Munich, Fed. Rep. of Germany

[73] Assignee: Siemens Aktiengesellschaft, Berlin & Munich, Fed. Rep. of Germany

[21] Appl. No.: 511,230

[22] Filed: Jul. 6, 1983

[30] Foreign Application Priority Data

Aug. 19, 1982 [DE] Fed. Rep. of Germany ....... 3230872
Nov. 8, 1982 [DE] Fed. Rep. of Germany ....... 3241601

[51] Int. Cl.³ ............................................. H01L 41/08
[52] U.S. Cl. ..................... 310/328; 310/366; 310/316; 310/319
[58] Field of Search ................ 310/328, 366, 330–331, 310/316, 319

[56] References Cited

U.S. PATENT DOCUMENTS

| | | | |
|---|---|---|---|
| 2,883,486 | 4/1959 | Mason | 310/328 X |
| 3,296,467 | 1/1967 | Locher | 310/328 X |
| 3,748,503 | 7/1973 | Cobarg et al. | 310/331 |
| 4,093,885 | 6/1978 | Brown | 310/331 |
| 4,359,892 | 11/1982 | Schnell et al. | 310/332 X |

*Primary Examiner*—Mark O. Budd
*Attorney, Agent, or Firm*—Hill, Van Santen, Steadman & Simpson

[57] ABSTRACT

A piezo-electric control element with a monitoring system is formed of lamellae of piezo-electric material whose longitudinal direction extends in an actuation direction of the control element. The lamellae are interconnected to form at least one lamella packet and electrodes are provided for applying electric actuation voltage at opposite principal faces of the lamella. At lest one lamella of the packet has on one principal face a measuring electrode which extends over a portion of the lamella and which is opposite a cooperating electrode on an opposite principal face of the lamella. The measuring electrode has an electric terminal separately provided for measurement of displacement and/or speed, or actuating force.

9 Claims, 4 Drawing Figures

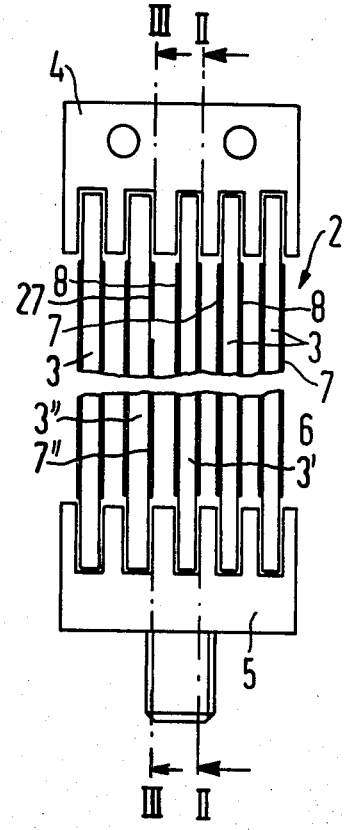
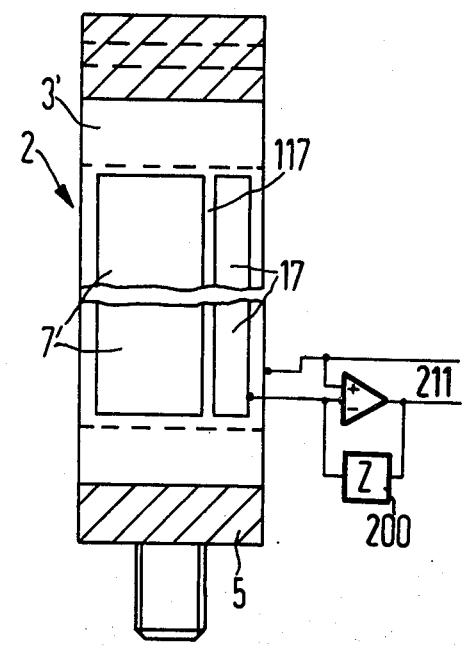

U.S. Patent  Sep. 11, 1984  Sheet 2 of 2  4,471,257
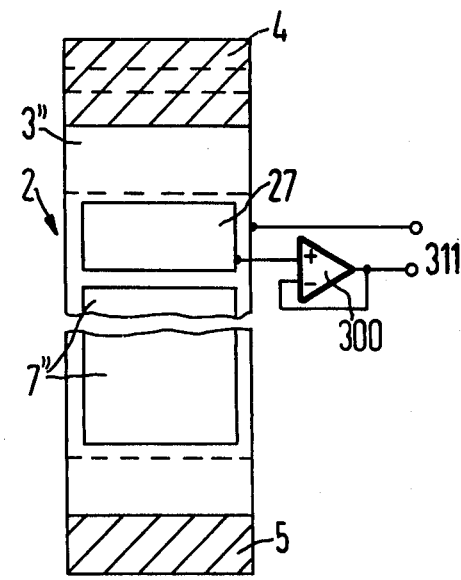
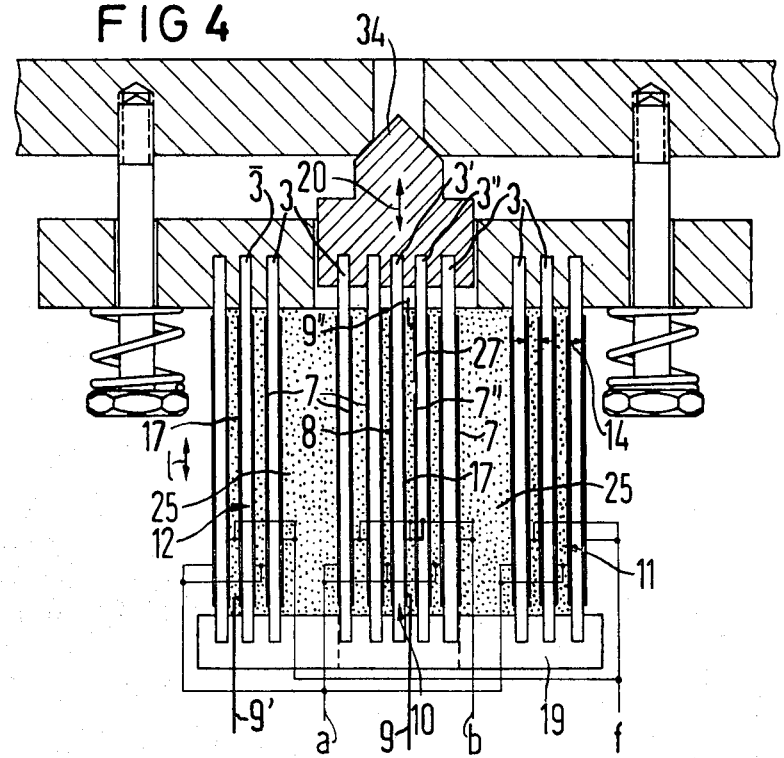

MONITORING SYSTEM FOR ELECTRICALLY ACTUATED CONTROL ELEMENT

BACKGROUND OF THE INVENTION

The present invention relates to an electrically actuated control element having lamellae of piezoelectric material whose longitudinal direction extends in an actuation direction of the control element and which are interconnected to form at least one lamella packet, and wherein electrodes are provided for applying electric actuation voltage at opposite principal faces of the lamella.

Piezo-electric final control elements are known from the German application Nos. 30 40 563 and 30 48 631 respectively corresponding to U.S. application Ser. Nos. 315,359 and 328,618, all incorporated herein by reference. These control elements have one or more lamella packets in which the lamellae have their longitudinal direction extending in the actuation direction of the control element, which are connected to one another, and which lie next to one another. The electrodes with which a respective electrical field directed in the thickness direction of the lamellae can be generated in the material of the lamellae (by applying a corresponding electric voltage) are provided between the lamellae or on the principal surfaces of the individual lamellae. Despite the fact that only the $d_{31}$-effect is exploited, many mechanically manipulated variables can be achieved with such control elements having lamella packets by means of applying electric voltages. In the control case, however, these manipulated variables are nonetheless so small that they cannot be detected with scales or the like without further techniques.

SUMMARY OF THE INVENTION

An object of the present invention is to specify a technique for a final control element with whose assistance the momentary, operational displacement or speed and/or actuating force of the lamella packet can be identified in a simple manner, even when the forces or control excursions change in a rapid sequence. This object is achieved by providing a measuring means for momentary operation-wise force displacement and/or speed, or the measurement of actuating force. At least one lamella packet has at least one lamella with a measuring electrode on a principal face thereof which extends over at least a portion of the lamella and which is opposite a cooperating electrode on an opposite principal face of the lamella. The measuring electrode has an electric terminal separately provided for measurement. For measurement of displacement and/or speed, the measuring electrode extends over at least a significant part of a length of the lamella. For measurement of actuating power, the measuring electrode extends over only a part of a length and over at least a significant part of the width of the lamella.

A starting point for the present invention was the perception that reliable measurements can only be directly carried out at the lamella packet, and that potentially conceivable mechanical couplings allow neither the desired reliability nor the durability and display precision to be achieved.

The mechanical lamellae of the final control element generate force and mechanical displacement given an adjacent electrical field due to the piezo-electric effect. Inversely, however, this effect also enables a mechanically induced excursion of a piezo-electric body to be quantitatively detected with the assistance of the charge shift thereby occurring, and allows its dynamic effect to be quantitatively identified by means of the charge. It is particularly advantageous structure-wise and in terms of manipulation to reserve and employ a lamella otherwise employed for generating the displacement as a measuring element and for this purpose to guide at least this one of the lamella electrodes out of the lamella packet separately or for separate connection. The electrical measurement of the momentary control excursion then occurs electrically between the terminal which has been guided out and the corresponding cooperating electrode of the lamella which can be electrically connected to the remaining cooperating electrodes of the further lamellae. Both mutually opposite electrodes of the lamella reserved for the measurement can also be separately guided out. The analogous case also applies to a force measurement. In order to sacrifice as little displacement or actuating force due to the inventive techniques, it can be advantageous to provide and guide a separate electrode out only on a portion of the principle surface of the reserved lamella. As a rule, the charge or charge shift which occurs in the region of a portion of an individual lamella of the lamella packet already suffices for an electrical measurement.

Given a plurality of lamella packets belonging to a single final control element, and in particular given a tandem elongator of the application U.S. Ser. No. 328,618, it is preferable to reserve one of the lamellae or an integral part of an individual lamella as the measuring element in each individual lamella packet and to electrically connect these individual measuring elements of the existing lamella packets to one another additively, namely in the same manner as the individual packets cooperate in the overall elongator. For an elongator according to FIG. 1 of the aforementioned U.S. application, for example, wherein the one lamella packet is excited for contraction and the other is simultaneously excited for dilation, the overall measured quantity derives from the individual sub-measured quantities of the individual lamella packets.

BRIEF DESCRIPTION OF THE DRAWINGS

FIG. 1 shows a control element with monitoring electrodes and having only one lamella packet;

FIG. 2 shows a monitoring electrode arrangement for measuring a control value;

FIG. 3 shows a monitoring electrode arrangement for force measurement; and

FIG. 4 shows a tandem control element with a plurality of lamella packets and monitoring electrode arrangement.

DESCRIPTION OF THE PREFERRED EMBODIMENTS

The control element 2 in FIG. 1 contains a plurality of lamellae 3 consisting of piezo-ceramic material disposed as illustrated between which clearances 6 are situated which can be filled in with a mechanical material connecting the lamellae 3. Departing from the illustration of FIG. 1, such clearances 6 are usually relatively small in comparison to the thickness of the lamellae 3. An arrangement as disclosed in FIG. 1 of U.S. application Ser. No. 315,359 wherein the ceramic lamellae lie tightly against one another can, however, also be provided for such a lamella packet.

At their ends, the ceramic lamellae 3, 3', 3" are mechanically held in tail pieces 4 and 5 so that they form a unit in terms of their mechanical activity. The lamellae 3 have the illustrated electrodes 7 or 8 at their respective principal faces. These electrodes 7 and 8 are the electrode and cooperating electrode of the corresponding lamellae 3. An electrode 7' and an electrode 17 (not visible in FIG. 1) whose construction may be seen in greater detail from the sectional view of FIG. 2 are provided on the one principal face of the one lamella 3'. The electrodes 7" and 27 (instead of the electrode 7) whose construction can be seen in greater detail from FIG. 3 are provided on the electrode 3".

For operation of a control element according to FIG. 1, all electrodes 7, 7', 7" on the one hand and all electrodes 8 on the other hand are electrically interconnected and are charged electrically in parallel with the provided electric control voltage. The polarization of the lamellae 3, 3', 3" is selected such that respectively uniform mechanical behavior exists for all these lamellae (contraction or dilation depending upon the operational sign of the electric control voltage).

The electrode 7' is visible from the front in FIG. 2. It can be seen that the electrode 7'—in contrast to the remaining electrodes 7 (and the cooperating electrodes 8)—only covers a part of the entire principal face of the lamella 3. Leaving a spacer strip 117 serving the purpose of electrical insulation, a further part of the principal face of the lamella 3' is covered with a further electrode 17. A part of the cooperating electrodes 8, which is also the cooperating electrode for electrode 7', and is situated on the back side of the lamella 3' in FIG. 2, resides opposite the further electrode 17.

The electrode 7' and the part of the cooperating electrode 8 lying opposite it (as well as the remaining electrodes 7 and cooperating electrode 8 of the remaining lamellae 3) belong electrically and mechanically to the actual final control element and are electrically wired to one another in a known manner.

The further electrode 17 provided next to the electrode 7' is a longitudinal strip on the corresponding principal face of the lamella 3'. The part of the cooperating electrode 8 (not visible in FIG. 2 and present on the back side of the lamella 3') lying opposite said electrode 17 together with electrode 17 form an electrode part which is designed as an inventively provided measuring element adapted for measurement of the momentary displacement or speed which is mechanically coupled to the remainder of the lamella 3', so that the dilatation and contraction occurring during operation of the final control element also exists in that part of the lamella 3' situated below the electrode 17. Due to the piezo-electric effect, an electrical charge shift in the material of the lamella 3' below the electrode 17 results from the mechanical distortion, this being amplified with the assistance of a charge amplifier 200 or being amplified for dynamic events with a current amplifier. The impedance Z is a capacitor in a charge amplifier and is an ohmic resistor in a current amplifier. Since the electrode 17 extends over the entire length L of the lamella 3' which is exposed to a mechanical distortion during operation, the displacement or speed derives as an integral value given a measurement of the respective charge shift as provided. This is valid for the lamella 3' and thus for the overall lamella packet. Let it be pointed out for the sake of completeness that the electrode 17 can also cover the entire, corresponding principal face of the electrode 7'. A proportionally larger charge signal then indeed derives for the amplifier 200 but this lamella 3' would then not contribute to the control drive. In case an electrode 17 were to be made shorter than the length L, a corresponding correction in terms of the integral overall behavior of the lamella 3' in the packet 2 of the final control element would have to be taken into consideration for the measurement of the displacement.

Because of the sufficiently sensitive electronic amplifiers available, it usually suffices that as can be seen from FIG. 2 the further electrode 17 only covers a strip portion of the lamella 3'. The output of the amplifier 200 is referenced 11. Given an asymmetrical connection of the amplifier 200 illustrated only by way of example, the terminal connected in the control case to the cooperating electrode 8 is the common ground pole.

FIG. 3 shows a construction of a further electrode 27 provided according to the invention and which is specifically designed and dimensioned for detecting the actuating power or accelerating force of the final control element according to FIG. 1. The portion of the principal face of the lamella 3" visible in the plan view in FIG. 3 which is still available is covered with an electrode 7" which, together with the electrodes 7 and 7', is available for the actual control operation.

The further electrode 27 preferably extends over the entire width of the lamella 3" and advantageously extends over only a part of the length L. A part of the electrode 8 corresponding to the surface of the electrode 27 which is situated on the back side of the lamella 3" is the cooperating electrode for the electrode 27.

Depending upon the disposition of the further electrode 27 at the upper end of the lamella 3" (as illustrated in FIG. 3) or at the lower end of the lamella, the dynamic actuating force is measured at the corresponding end of the final control element, namely, with or without taking the forces of inertia of the lamella packet itself into consideration. When the tail piece 7 is the resting part of the final control element, then the accelerating force at the opposite, upper end part 4 is measured by placing the further electrode 27 at the opposite end of the lamella 3", i.e. measured without the forces of inertia of the lamellae 3.

A voltage amplifier 300 accepts (given a high-resistance input of the amplifier 300) the electrical voltage occurring between the electrode 27 and the part of the cooperating electrode 8 (given inhibited charge equalization) and emits it at the output 311 as an amplified no-load voltage signal.

A reliable distinction can be made between the measurable variables displacement and actuating force on the basis of the above-explained disposition of the respective, further lamella 17 or 27. An exact, electrical integration over the electrode length occurs by means of measuring the charge shift for the displacement or the no-load voltage for the force, even in the dynamic case given which inhomogeneous mechanical voltage curves occur. Furthermore, errors occurring in large signal operation due to the non-linearity of the elastic constants are reduced.

Insofar as a sufficiently large plurality of lamellae exists in a lamella packet 2 of a control element, the separate lamellae 3' and 3" as discussed above will be advantageously employed when measurement of the control excursion and of the actuating power is required. Fundamentally, however, correspondingly designed further electrodes 17 and 27 can also be provided at one and the same principal face of a single lamella (with the corresponding terminals for the amplifiers 200 and 300). The electrode 17 is made shorter than the length L by somewhat more than the length of the electrode 27, and the overall width of the lamella is made available for the electrode 27. Alternatively, the further electrode 27 is made narrower than the width of the lamella by somewhat more than the width of the electrode 17.

FIG. 4 shows a tandem control element of U.S. application Ser. No. 328,618 comprising a first lamella packet 10 and two further lamella packets 11 and 12. The two lamella packets 11 and 12 are mechanically connected parallel to one another and are operated in anti-phase relative to the lamella packet 10. A resulting motion of the final control element 34 which is pointed out with the double arrow 20 is thus obtained.

The individual lamellae in FIG. 4 are also referenced 3 regardless of their inclusion to a respective packet. Each of the lamellae again has electrodes 7 and cooperating electrodes 8 which are electrically interconnected to one another in the manner illustrated in FIG. 3 for (anti-phase) tandem operation. The electrical terminals guided out for supplying the control voltages are referenced a, b and f, whereby three external terminals are provided here in order to be able to execute the mode with energy recovery disclosed in U.S. application Ser. No. 328,618.

The polarization in the individual lamellae 3 for the one packet 11 is indicated with 14.

Reference numeral 25 indicates a material which fills interstices between lamellae.

Given a sample embodiment of FIG. 4, for example, the lamella situated in the center of the lamella packet 10 has an electrode 17 on its one principal face, the standard cooperating electrode 8 residing opposite said electrode 17. The electrode 17 can again be a narrow longitudinal strip (as in FIG. 2) or can also be an electrode covering the entire lamella 3'. As in FIG. 2, the electrical terminal of this further electrode 17 belonging to the measuring element is referenced 9.

It generally suffices for a tandem elongator as illustrated and as disclosed in U.S. application Ser. No. 328,618 to provide such a further electrode 17 reserved for the manipulated variable measurement on only one lamella 3' of the one lamella packet 10, since the two other sub-packets 11 and 12 are functionally operated with the packet 10. The sample embodiment illustrated in FIG. 4, however, has another further electrode 17' in the packet 12 as well, this preferably covering (as in the example of FIG. 2) a strip of the principal face of the corresponding lamella 3. Accordingly, the sub-packets 11 and 12 remain practically electromechanically equivalent in the final control element. Given simultaneous contraction of the packet 10 and dilatation of the packets 11 and 12, voltage signals with opposite operational signs (or, respectively, alternating voltage signals having opposite phase) are emitted at the terminals 9 and 9' of the electrodes 17 and 17' relative to the cooperating electrodes 8. These are correspondingly wired and are supplied for the resultant evaluation to the electronics of the measuring element of the invention.

Given the corresponding interconnection of the terminals 9 and 9', the employment of a further electrode 17 serving as a measuring element in one lamella packet 10 and the employment of another further electrode 17' in a lamella packet 12 of the tandem elongator operated in anti-phase offers the advantage that the overall electrical measured result from the electrodes 17 and 17' is temperature-compensated.

An amplifier 200 is to be connected to the terminals 9, 9', as described in FIG. 2.

The control element of FIG. 4 also contains a lamella 3'' which differs from the lamellae 3 by an electrode 27 for force measurement. This is related to the valve cone 34 and the remaining electrode 7''. The connection of the electrode 27 is referenced 9''. An amplifier 300 is connected thereto. Remaining details concerning the electrodes 27, 7'' proceed from the description of FIG. 3.

Although various minor changes and modifications might be proposed by those skilled in the art, it will be understood that I wish to include within the claims of the patent warranted hereon all such changes and modifications as reasonably come within my contribution to the art.

I claim as my invention:

1. In a control element which is electrically actuated and comprises lamellae of piezo-electric material whose longitudinal direction extends in an actuation direction of the control element and which are interconnected to form at least one lamella packet, and wherein electrodes are provided for applying electric actuation voltage at opposite principal faces of the lamella, wherein the improvement comprises: a measuring means for measuring momentary operation-wise displacement and/or speed; said measuring means including at least one lamella packet having at least one lamella on whose one principal face a measuring electrode which extends over at least a significant part of a length of the lamella is provided and which is opposite a cooperating electrode on an opposite principal face of the lamella; and said measuring electrode having an electric terminal separately provided for measurement.

2. A control element according to claim 1 wherein the measuring electrode covers only a partial surface of the corresponding lamella.

3. A control element according to claim 1 wherein an amplifier is connected at the terminal of the measuring electrode.

4. A control element according to claim 1 wherein the lamella packet has two measuring electrodes each of which is associated with a cooperating electrode, one of the measuring electrodes being dimensioned and positioned for measurement of operation-wise displacement or speed and the other for measurement of force.

5. In a control element which is electrically actuated and comprises lamellae of piezo-electric material whose longitudinal direction extends in an actuation direction of the control element and which are mutually connected to form at least one lamella packet, and wherein electrodes are provided for applying an electric actuation voltage on the lamella at opposite principal faces of the lamella, wherein the improvement comprises: measuring means for measuring momentary, operation-wise longitudinal actuating force; said measuring means including at least one lamella packet having at least one lamella on whose one principal face a measuring electrode extending over only a part of a length and over at least a significant part of a width of the lamella is provided, a cooperating electrode residing opposite said measuring electrode at an opposite principal face of the lamella; and said measuring electrode having an electric terminal separately provided for measurement.

6. A control element according to claim 5 wherein the measuring electrode is positioned adjacent an end of the lamella of the lamella packet whose dynamic actuating power is to be measured.

7. A control element according to claim 5 wherein a voltage amplifier is connected at the terminal of the measuring electrode.

8. A control element according to claim 5 wherein the lamella packet has two measuring electrodes each of which is associated with a cooperating electrode, one of the measuring electrodes being dimensioned and positioned for measurement of operation-wise longitudinal displacement or speed and the other for measurement of power.

9. In a control element which is electrically actuated and comprises lamellae of piezo-electric material whose longitudinal direction extends in an actuation direction of the control element and which are interconnected to form at least one lamella packet, and wherein electrodes are provided for applying electric actuation voltage at opposite principal faces of the lamella, wherein the improvement comprises: a measuring means for measuring momentary operation-wise longitudinal displacement and/or speed, or measurement of longitudinal actuating force; said measuring means being formed by at least one lamella of at least one lamella packet on whose one principal face a measuring electrode extends over a significant portion of the lamella and which is opposite a cooperating electrode on an opposite principal face of the lamella; and said measuring electrode having an electric terminal separately provided for measurement.

* * * * *